United States Patent [19]

Horton et al.

[11] Patent Number: 6,010,916

[45] Date of Patent: Jan. 4, 2000

[54] METHOD FOR IMPROVING SEMICONDUCTOR WAFER PROCESSING

[75] Inventors: Stephen D. Horton, Pleasanton; Theodros W. Mariam, San Jose, both of Calif.

[73] Assignee: Advanced Micro Devices, Inc., Sunnyvale, Calif.

[21] Appl. No.: 08/985,553

[22] Filed: Dec. 5, 1997

[51] Int. Cl.[7] ............................ G01R 31/26; H01L 21/66
[52] U.S. Cl. ............................................................. 438/17
[58] Field of Search ................................... 438/14, 17

[56] References Cited

U.S. PATENT DOCUMENTS

| | | | |
|---|---|---|---|
| 5,527,707 | 6/1996 | Fukazawa | 436/72 |
| 5,709,754 | 1/1998 | Morinville et al. | 134/1.3 |
| 5,762,688 | 6/1998 | Ziger et al. | 95/212 |

*Primary Examiner*—Brian Dutton
*Attorney, Agent, or Firm*—Mikio Ishimaru

[57] ABSTRACT

In the processing and handling of semiconductor silicon wafers, blank silicon wafers are replaced by chemically inert wafers during setup, adjustment, and operation. The inert material wafers eliminate the breakage associated with blank, silicon wafers while helping to purge the semiconductor wafer processing equipment of particulate contaminates.

10 Claims, 1 Drawing Sheet

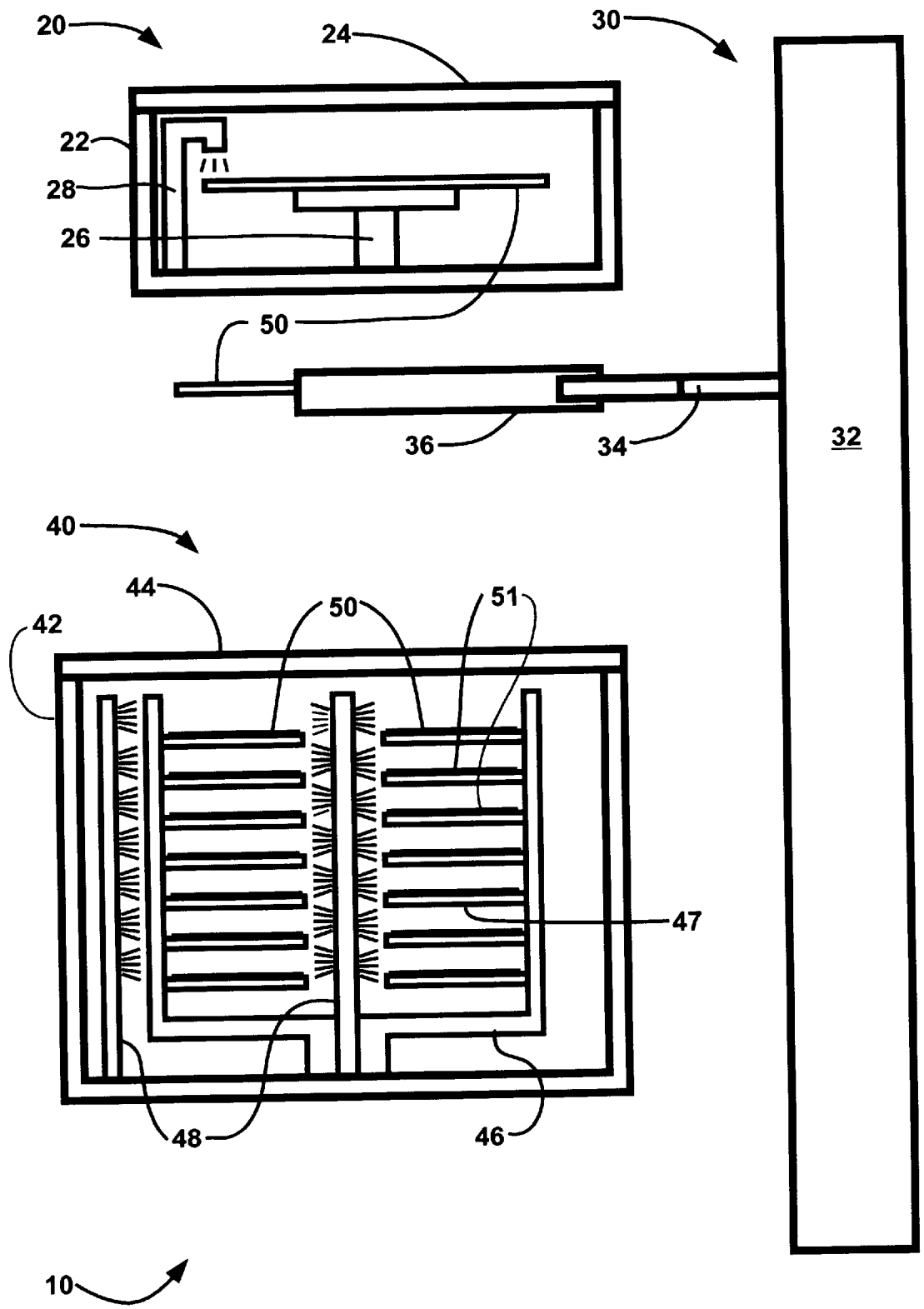

METHOD FOR IMPROVING SEMICONDUCTOR WAFER PROCESSING

TECHNICAL FIELD

The present invention relates generally to semiconductor wafer handling and processing and more specifically to semiconductor wafer equipment setup, adjustment, and operation.

BACKGROUND ART

In the past, for all purposes related to semiconductor wafer handling and processing, the industry-wide standard operating procedure has been to use actual blank silicon wafers, or dummy wafers. It is an accepted practice that all semiconductor handling and processing systems starting from initial wafer cleaning through handling for all of the process steps to final dicing of the wafer are setup, tested, adjusted, and run using blank silicon wafers.

It is acknowledged that periodically there will be broken, blank silicon wafers due to misadjustments or improper handling. It has become accepted in the industry that broken silicon wafers will have to be periodically cleaned out of various processing systems.

Further, it is recognized that systems will have to be purged of the fine silicon particles of microscopic size which result from broken, blank silicon wafers. It is also well known that all these particles may not be able to be cleared out of the various systems and will produce microscratches on production silicon wafers and will cause defects in the end semiconductor devices.

The use of actual blank silicon wafers throughout the entire process has long been known to be the most realistic and economical approach to all semiconductor wafer processing equipment setup, testing, adjustment, and operation.

DISCLOSURE OF THE INVENTION

The present invention provides for the step of using inert material wafers as a replacement for blank silicon wafers during semiconductor/wafer handling and processing equipment setup.

The present invention also provides for the step of using inert material wafers as a replacement for blank silicon wafers during semiconductor/wafer handling and processing equipment testing and adjustment.

The present invention also provides for the step of using inert material wafers as a replacement for blank silicon wafers during semiconductor wafer handling and processing equipment operation.

The present invention further provides for the step of using identically sized tetrafluoroethylene resin wafers for replacement of blank silicon wafers during semiconductor wafer handling and processing operations.

The present invention further provides for the step of using identically sized and weighted tetrafluoroethylene resin wafers for replacement of blank silicon wafers during semiconductor wafer handling and processing operations.

One advantage of the present invention is to improve the overall efficiency of the manufacturing process for semiconductors by reducing the downtime of equipment for cleaning out the residue of broken, blank silicon wafers.

Another advantage of the present invention is to reduce the cost of manufacturing semiconductors by not having to constantly replace blank silicon wafers.

A further advantage of the present invention is to improve the end product, the semiconductor device itself, by eliminating one source of the particulate contamination and scratching of the silicon wafers.

A still further advantage of the present invention is to help purge the processing systems of particulate contaminants.

The above and additional advantages of the present invention will become apparent to those skilled in the art from a reading of the following detailed description when taken in conjunction with the accompanying drawing.

BRIEF DESCRIPTION OF THE DRAWING

The drawing is a schematic illustration of the typical semiconductor wafer handling and processing system in which the method of the present invention is associated.

BEST MODE FOR CARRYING OUT THE INVENTION

Referring now to the drawing, therein is shown a typical semiconductor wafer handling and processing system which is designated as the overall system 10. The overall system 10 typically consists of at least three interrelated but separate systems. For example, in the drawing are shown a resist application system 20, a wafer handling system 30, and an acid cleaning system 40.

The resist application system 20 generally consists of a housing 22 with a cover 24. Inside the resist application system 20, which is shown as a simplified schematic, there is a rotatable vacuum chuck 26 and a resist supply system shown with liquid resist spraying out, designated by 28. The rotatable vacuum chuck 26 holds wafers by application of vacuum and spins the wafers. During spinning, the resist is sprayed onto the wafer. The spinning assures complete coverage of the wafer and helps in controlling the thickness of the resist film on the wafer.

The wafer handling system 30 generally consists of a robot 32 having a robot arm 34 with a wafer handling grip 36. While shown as a robot 32 with an arm 34 and a grip 36, it should be understood that the simplified schematic represents numerous types of wafer transfer and transport mechanisms which are well known in the industry. In its full range of transport, the wafer handling system 30 would transport wafers to and from various semiconductor wafer processing systems. The resist application system 20 and the acid cleaning system 40 are only examples and may not appear in actual systems in the arrangement shown.

The acid cleaning system 40 generally consists of a housing 42 with a cover 44. Within the housing 42 is a rotor 46 containing wafer carrying racks 47, shown in schematic form. Also inside the housing 42 are a series of acid spray pipes 48, shown spraying acid. While the acid spray pipes 48 are spraying acid, the rotor 46 spins the wafer carrying racks 47 so that the force of the spray and the speed of the spin carries off particulate contaminants from the surface of the wafers. The wafer carrying racks 47 are separated by spacers (not shown) to allow access to the sprayed acid.

In the drawing, the resist application system 20 is shown in a setup and test condition; the wafer handling system 30 is shown in an adjustment condition; and the acid cleaning system 40 is shown in a run or operating condition. In each is shown an inert material wafer 50 which is inert as far as the chemicals used in the semiconductor processing are concerned.

The inert material wafer 50 in the best mode is made from tetrafluoroethylene resin, known by the trademark Teflon, and is sized to be identical to the blank silicon wafer used by the overall system 10. In some situations where the weight is critical, the inert material wafer 50 can contain a thin metal plate or inert metal particles to add weight to the Teflon so it will be identically sized and weighted as a production silicon wafer.

It should be noted that another material other than Teflon would have to be used where the semiconductor wafer processing requires temperatures higher than Teflon will tolerate.

In the acid cleaning system 40 are shown production silicon wafers 51 which are loaded on the wafer carrying racks 47 before the top rack which carries a number of inert material wafers 50. The inert material wafers 50 are used during production operation as well as during setup, adjustment, and testing.

In operation, the inert material wafer 50 would be used to set up the wafer handling system 30. The robot 32, the robot arm 34, and the wafer grip 36 would go through the necessary motions to pick up the inert material wafer 50. If the wafer grip 36 is too tight or the robot arm 34 and the robot 32 accidentally hit other equipment, the inert material wafer 50 will not break. In most instances, the worst that will occur will be that the inert material wafer 50 will bend. Due to the inherent flexibility of inert material, the inert material wafer 50 would just be straightened and continue to be used while the wafer handling system 30 is adjusted for final setup to the best operational condition. Finally, the handling system 30 would position the inert material wafer in processing equipment such as the resist application system 20.

The resist application system 20 is used to coat silicon wafers with resist. When the inert material wafer 50 is placed by the wafer handling system 30 onto the rotatable vacuum chuck 26, a vacuum is used to hold the inert material wafer 50 in place. If the wafer handling system 30 does not place the inert material wafer 50 in exactly the right place on the rotatable vacuum chuck 26, the imbalance will cause the inert material wafer 50 to be flung off the rotatable vacuum chuck 26. Therefore, the-inert material wafer 50 is used here not only to setup the wafer handling system 30 but also to test to assure proper balancing of silicon wafers in the resist application system 20.

Also, in the resist application system 20, the proper spray pattern for the resist supply 28 may also be tested using the inert material wafer 50 since the wafer must be spinning at speed so the spray pattern will be visible.

The wafer handling system 30 also removes the inert material wafer 50 from the resist application system and moves it onto other systems. The acid cleaning system 40 is typical of such other systems. The inert material wafer 50 would be used to set the wafer handling system up for inserting production silicon wafers 51 onto the wafer carrying racks 47.

In addition, it has been determined that it is advantageous to use inert material wafers 50 on the top wafer carrying rack 47 in the acid cleaning system 40. Although the reason for this is not clear, it appears that when the acid spray pipes 48 spray acid and the rotor 46 starts to turn at high speed, the sprays force small particles from the lower wafers 51 and cause them to ride up and migrate through the acid cleaning system 40 on the acid until they accumulate on the top wafers. When blank silicon wafers are used, the particles tend to fall back into the housing 42 when the blank silicon wafers are being removed from the housing 42. When the top wafers are the inert material wafers 50, the electrostatic attraction characteristic of Teflon tends to hold particles to the inert material wafers 50 where they can be removed from the acid cleaning system 40 and washed off later.

It should be noted that where the previous use of blank silicon wafers resulted in contamination, the use of inert material wafers 50 actually helps purge the system.

While the invention has been described in conjunction with a specific best mode and alternate embodiment, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for adjusting semiconductor wafer processing equipment comprising the steps of:

placing an inert material wafer in the semiconductor wafer processing equipment;

operating the semiconductor wafer processing equipment to process said inert material wafer;

determining an adjustment to the semiconductor wafer processing equipment using said inert material wafer; and adjusting the semiconductor wafer processing equipment towards the adjustment.

2. The method as claimed in claim 1 including equipment for handling silicon wafers through a plurality of locations and including the step of:

moving said inert material wafer through the plurality of locations.

3. The method as claimed in claim 1 wherein the semiconductor wafer processing equipment performs test requiring processing operations on semiconductor wafers and includes the step of:

testing the processing operation on said inert material wafer.

4. The method as claimed in claim 1 wherein the semiconductor wafer processing equipment includes rotating equipment requiring semiconductor wafers to be balanced in the rotating equipment and including the step of:

balancing the rotating equipment using said inert material wafer.

5. A method for setting up semiconductor wafer handling and processing equipment comprising the steps of:

replacing a silicon wafer in the semiconductor wafer handling equipment with a Teflon wafer;

operating the semiconductor wafer handling equipment with said Teflon wafer among the semiconductor processing equipment;

processing said Teflon wafer in the semiconductor wafer processing equipment;

determining an adjustment to the semiconductor wafer handling and processing equipment; and adjusting the semiconductor wafer handling and processing equipment towards said adjustment.

6. The method as claimed in claim 5 wherein the semiconductor wafer processing equipment is for handling silicon wafers through a plurality of locations and includes the step of:

moving said Teflon wafer through the plurality of locations.

7. The method as claimed in claim 5 wherein the semiconductor wafer processing equipment performs test processing operations on silicon wafers and includes the step of:

testing the processing operation on said Teflon wafer.

8. The method as claimed in claim 5 wherein the semiconductor wafer processing equipment requires semiconductor wafers to be balanced in the semiconductor wafer processing equipment and includes the step of:

balancing said semiconductor wafer processing equipment using said Teflon wafer.

9. A method for operating semiconductor wafer processing equipment comprising the steps of:

placing a Teflon wafer in the semiconductor wafer processing equipment;

operating the semiconductor wafer processing equipment whereby said Teflon wafer attracts and retains particulate contamination in said semiconductor wafer processing equipment; and eliminating the particulate contamination from said semiconductor wafer processing equipment using said Teflon wafer.

10. The method as claimed in claim 9 wherein the semiconductor wafer processing equipment has a plurality of locations for the semiconductor wafer and includes the step of:

placing said Teflon wafer in one of the plurality of locations.

* * * * *